United States Patent
Ku et al.

(10) Patent No.: US 7,724,009 B2
(45) Date of Patent: May 25, 2010

(54) METHOD OF MAKING HIGH-FREQUENCY PROBE, PROBE CARD USING THE HIGH-FREQUENCY PROBE

(75) Inventors: Wei-Cheng Ku, Hsinchu Hsiang (TW); Kuan-Chun Chou, Hsinchu Hsiang (TW)

(73) Assignee: MPI Corporation, Chu-Pei, Hsinchu Hsiang (TW)

( * ) Notice: Subject to any disclaimer, the term of this patent is extended or adjusted under 35 U.S.C. 154(b) by 0 days.

(21) Appl. No.: 12/433,952

(22) Filed: May 1, 2009

(65) Prior Publication Data
US 2009/0212801 A1    Aug. 27, 2009

Related U.S. Application Data

(63) Continuation-in-part of application No. 11/704,331, filed on Feb. 9, 2007, now abandoned.

(51) Int. Cl.
*G01R 31/02* (2006.01)
(52) U.S. Cl. .................. 324/761; 324/754; 324/762
(58) Field of Classification Search .................. None
See application file for complete search history.

(56) References Cited

U.S. PATENT DOCUMENTS

| | | | |
|---|---|---|---|
| 4,739,259 A * | 4/1988 | Hadwin et al. | 324/761 |
| 4,791,363 A | 12/1988 | Logan | |
| 5,525,911 A | 6/1996 | Marumo et al. | |
| 6,298,312 B1 | 10/2001 | Chen | |
| 6,603,322 B1 * | 8/2003 | Boll et al. | 324/754 |
| 6,727,716 B1 | 4/2004 | Sharif | |
| 7,049,835 B2 | 5/2006 | Boll | |
| 7,304,488 B2 | 12/2007 | Gleason | |

FOREIGN PATENT DOCUMENTS

JP        2004037145 A1    2/2004

* cited by examiner

*Primary Examiner*—Minh N Tang
(74) *Attorney, Agent, or Firm*—Browdy and Neimark, PLLC (57) ABSTRACT

A high frequency probe preparation method for making a high frequency probe for high frequency testing to assure signal integrity by means of making a sleeve assembly subject to the size of a predetermined bare needle and then sleeving bare needle by the sleeve assembly to form a high-frequency probe is disclosed to include the steps of: a) providing an insulated tube, and b) forming a conducting layer on the outer surface of the insulated tube which having a metal layer for grounding. The insulated tube and the conducting layer constitute the sleeve assembly. The metal layer is formed by means of physical deposition, chemical deposition, mixture of physical and chemical deposition or electrochemical deposition.

15 Claims, 9 Drawing Sheets

METHOD OF MAKING HIGH-FREQUENCY PROBE, PROBE CARD USING THE HIGH-FREQUENCY PROBE

CROSS REFERENCE TO RELATED APPLICATIONS

The present application is a continuation-in-part of U.S. application Ser. No. 11/704,331 entitled HIGH FREQUENCY CANTILEVER-TYPE PROBE CARD filed on Feb. 9, 2007, now abandoned, the disclosure of which is incorporated herein by reference.

BACKGROUND OF THE INVENTION

1. Field of the Invention

The present invention relates to probe card technology and more specifically, to a high frequency probe preparation method of making a probe for high-frequency testing.

2. Description of the Related Art

Figure 1:
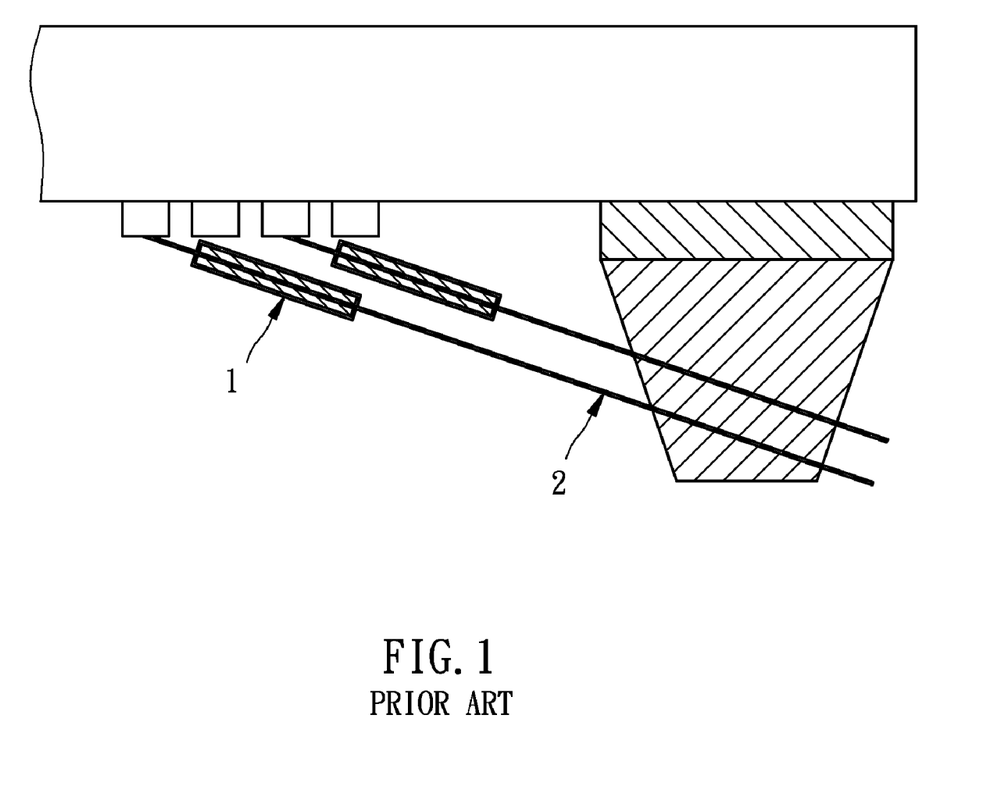
FIG. 1 is a schematic structural view of a probe card according to the prior art, showing the structure of the probe needle.
Figure 2:
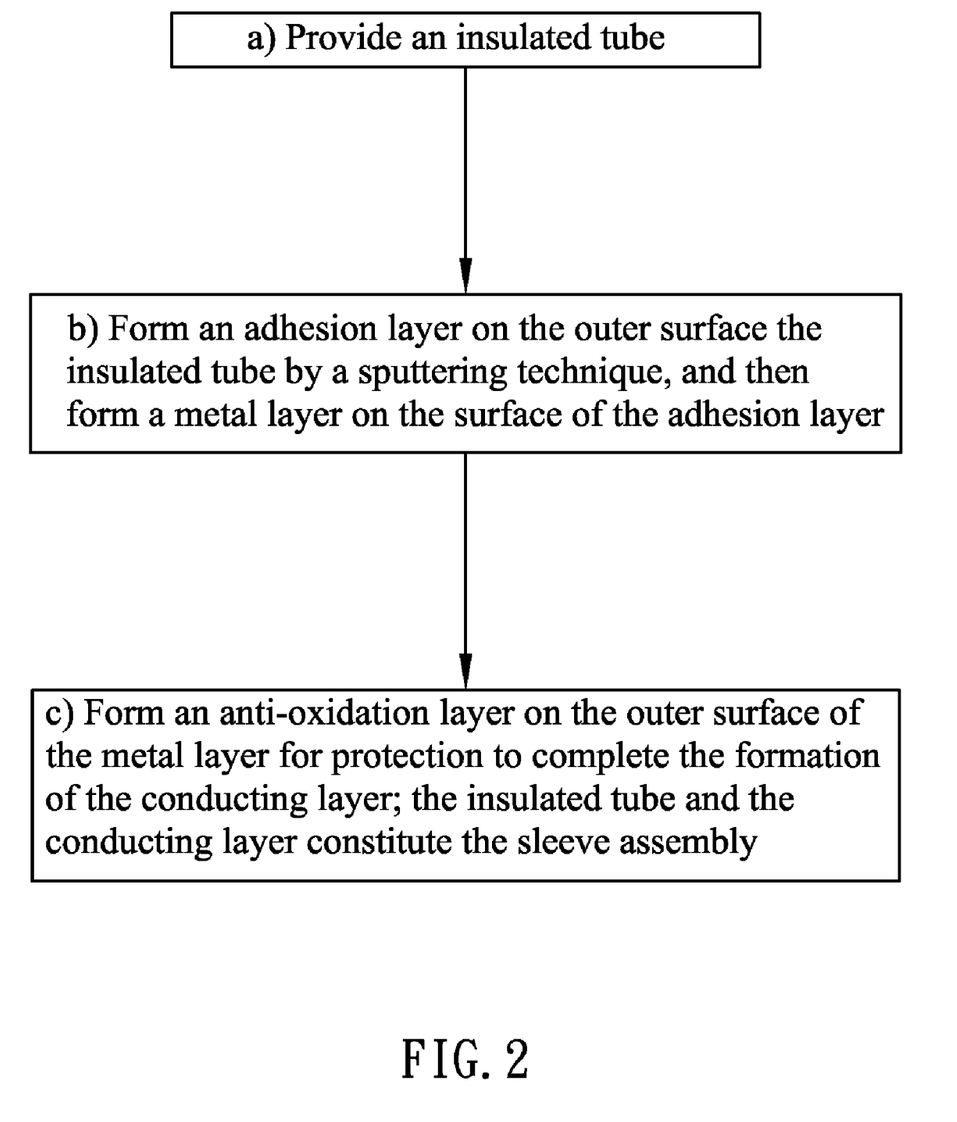
FIG. 2 is a flow chart of the preparation of a probe needle according to a first embodiment of the present invention.

Referring to FIG. 1, a conventional probe for probe card comprises a coaxial cable segment 1 and a probe needle segment 2 bonded to the coaxial cable segment 1 by means of pin connection. According to this design, the configuration of the coaxial cable segment 1 keeps impedance matching for signal transmission by avoiding signal attenuation. Thus, the probe is practical for the application of high-frequency transmission.

However, the pin connection between the coaxial cable segment 1 and the probe needle segment 2 tends to cause a signal discontinuous interface, i.e., signal transmission non-integrity.

To avoid the aforesaid problem, a high-strength probe needle segment may be used as a core member for further processing to make a coaxial cable type probe needle that provides impedance matching for signal transmission and eliminates the problem of signal discontinuity. U.S. Pat. No. 6,727,716 discloses a similar design, entitled "Probe card and probe needle for high frequency testing". According to this design, the high frequency probe needle 630 comprises a conductor 640, a dielectric sleeve 650 surrounding at least a portion of the conductor 640, and a conductive cover 652 surrounding the dielectric sleeve 650. Thus, the high frequency needle 630 can be prepared without pin connection, eliminating the problem of signal transmission non-integrity.

However, during preparation of the probe needle 630, it is necessary to make the conductive cover 652 and the dielectric sleeve 650 at first, and then to sleeve onto the conductor 640. Inevitably, the structure of the conductive cover 652 and dielectric sleeve 650 will be bent somehow in the step of sleeving the conductor 640. Further, when the end of the probe needle 630 is pressed on the electronic device to be tested during operation of the probe card, the cantilever part of the probe needle 630 will be curved, too. If the conductive cover 652 does not have excellent bending extensibility, the conductive cover 652 may be forced to crack and even to drop from the dielectric sleeve 650 during bending of the structure of the conductive cover 652 and dielectric sleeve 650. By the way, the bending extensibility of the conductive cover 652 is inverse proportional to its thickness. According to this design, the conductive cover 652 has a thickness over 1.5 mils, or about 38.1 µm. In practice, the thickness of the conductive cover 652 is excessively high, and the bending extensibility of the conductive cover 652 is insufficient to prohibit the conductive cover 652 from cracking when forcing the probe needle 630 to touch the device, thereby affecting signal transmission performance. Moreover, the thickness of the conductive cover 652 has a great concern with the total thickness of the probe needle 630. Since the conductive cover 652 has an excessively high thickness, the probe needle 630 will not be practical for fine pitch devices under high frequency test, thus limiting the application of the probe needle 630.

Therefore, it is desirable to provide a high frequency probe needle that eliminates the aforesaid problems.

SUMMARY OF THE INVENTION

The present invention has been accomplished under the circumstances in view. It is the main object of the present invention to provide a method of making high frequency probe, which is practical for a probe needle that is suitable for the transmission of high frequency signal and has the advantage of maintaining signal integrity.

To achieve this and other objects of the present invention, a high frequency probe preparation method is provided by means of making a sleeve assembly subject to the size of a predetermined bare needle and then sleeving the sleeve assembly onto the bare needle to form a high-frequency probe needle. The high frequency probe needle preparation method comprises the steps of: a) providing an insulated tube, and b) forming a conducting layer on the periphery of the insulated tube having a metal layer for grounding. The insulated tube and the conducting layer constitute the sleeve assembly. The metal layer is formed by means of physical deposition, chemical deposition, physical/chemical deposition or electrochemical deposition.

The sleeve assembly of the high frequency probe needle made according to the aforesaid high frequency probe needle preparation method provides better signal impedance matching, avoiding signal attenuation. Thus, the high frequency probe needle assures signal integrity during signal transmission through the high frequency probe needle. Therefore, the probe needle is practical for high frequency testing.

DETAILED DESCRIPTION OF THE INVENTION

Figure 3:
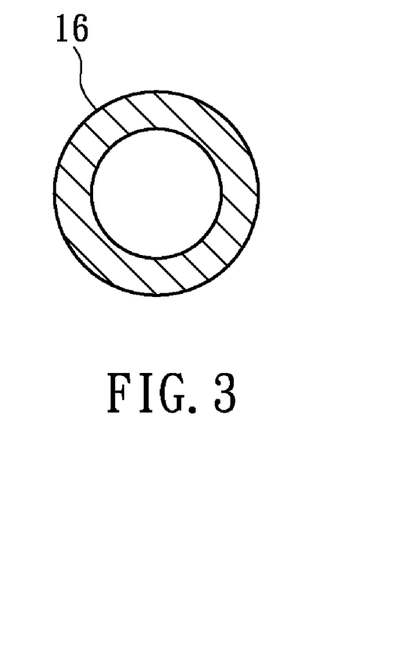
FIG. 3 is a schematic structural view of an insulated tube for probe needle according to the first embodiment of the present invention, showing the inner diameter of the insulated tube.
Figure 8:
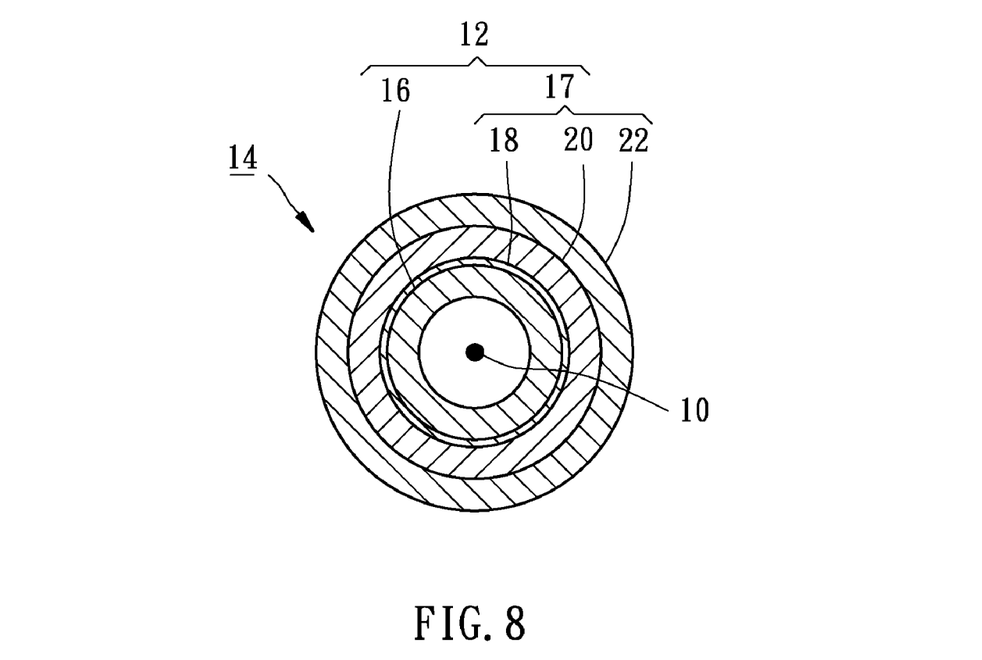
FIG. 8 is a schematic processing view of the first embodiment of the present invention, showing the formation of the anti-oxidation layer.

Referring to FIG. 2 and FIGS. 3-8, the invention provides a high frequency probe preparation method for making a high frequency probe by means of making a sleeve assembly 12 subject to the size of a predetermined bare needle 10 and then sleeving the bare needle 10 by the sleeve assembly 12 to form a high-frequency probe 14. The high frequency probe preparation method according to a first embodiment of the present invention includes the steps of:

a) Providing an insulated tube 16, as shown in FIG. 3.

b) Forming a conducting layer 17 on the outer surface of the insulated tube 16, as shown in FIG. 8. The insulated tube 16 and the conducting layer 17 constitute the said sleeve assembly 12. According to this embodiment, the conducting layer 17 comprises an adhesion layer 18, a metal layer 20, and an anti-oxidation layer 22.

The adhesion layer 18 is formed on the outer surface of the insulated tube 16 by means of a sputtering technique. The metal layer 20 is bonded to the outer surface of the insulated tube 16 via the adhesion layer 18, i.e., the adhesion layer 1 enhances the adhesion of the metal layer 20 to the outer surface of the insulated tube 16. Once the insulated tube 16 is curved in the step of sleeving the bare needle 10, the existence of the adhesion layer 18 lowers the possibility happened to the metal layer 20 of which peeling off the insulated tube 16, thereby assuring positive bonding of the metal layer 20 to the insulated tube 16.

The material of the adhesion layer 18 can be selected from Cr (chrome), Ti (titanium), W (tungsten), or any of their alloys. According to this embodiment, the adhesion layer 1 is made of titanium-tungsten alloy. However, titanium-tungsten alloy is simply an example but not a limitation. Further, the adhesion layer 18 has an optimum thickness within 0.01 µm~0.2 µm. According to this embodiment, the adhesion layer 18 has the thickness of 0.2 µm. As for the sputtering technique for the formation of the adhesion layer 18 during step b, it can be performed in either of two ways, i.e., the single-sputtering process and the multi-sputtering process.

Figure 4:
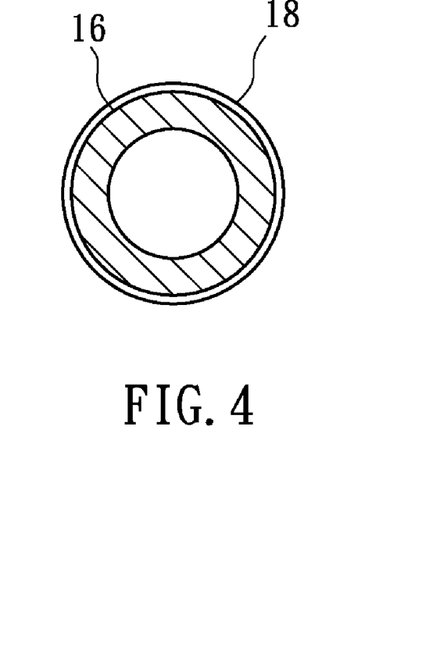
FIG. 4 is a schematic processing view of the first embodiment of the present invention, showing a single-sputtering process of the formation of the adhesion layer.

The single-sputtering process includes the sub-steps of:

b1) continuously rotating the insulated tube 16 during sputtering, as shown in FIG. 4, to have the desired adhesion layer 18 be coated on the outer surface of the insulated tube 16 evenly.

Figure 5:
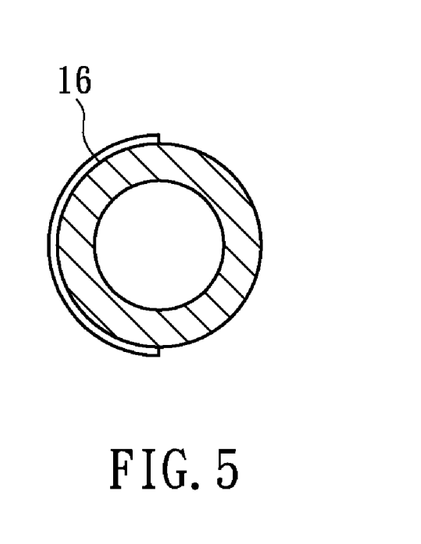
FIG. 5 is a schematic processing view of the first embodiment of the present invention, showing a multi-sputtering process of the formation of the adhesion layer.
Figure 6:
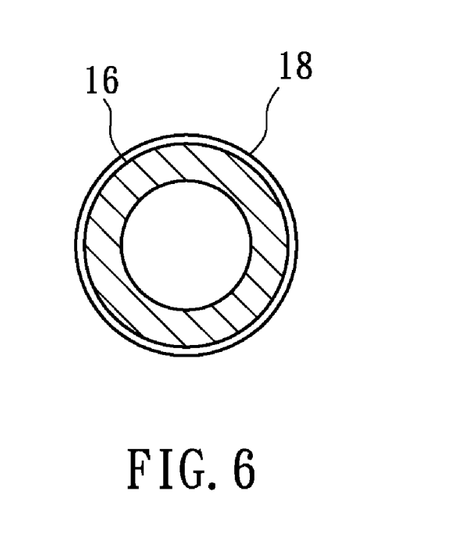
FIG. 6 corresponds to FIG. 5, showing the formation of the adhesion layer finished.

The multi-sputtering process includes the sub-steps of:

b1) dividing the outer surface of the insulated tube 16 into two zones (not shown); and b2) sputtering the two zones of the insulated tube 16 one after the other to form the adhesion layer 18.

By means of either of the aforesaid two sputtering techniques, the desired adhesion layer 18 is formed on the outer surface of the insulated tube 16 evenly.

Figure 7:
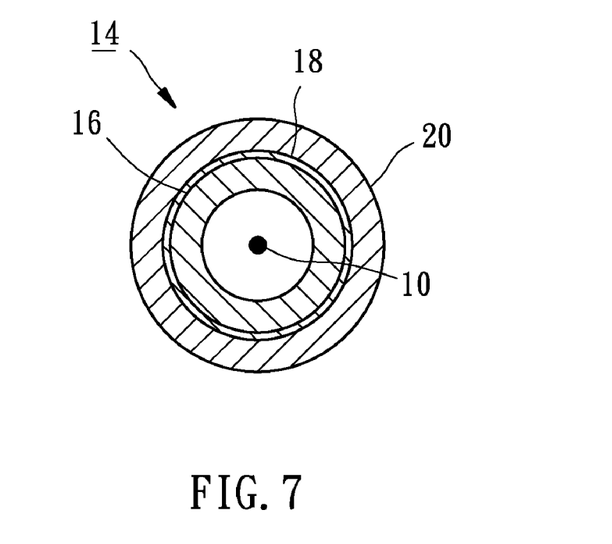
FIG. 7 is a schematic processing view of the first embodiment of the present invention, showing the formation of the metal layer.

The metal layer 20 is for electrically grounded. The formation of the metal layer 20 can be achieved by means of physical deposition, chemical deposition, mixture of physical and chemical deposition, or electrochemical deposition.

The physical deposition can be a physical vapor deposition (PVD), for example, sputtering. The chemical deposition can be chemical vapor deposition (CVD). The mixture of physical and chemical deposition can be plasma-enhanced chemical vapor deposition (PECVD). The electrochemical deposition can be employed by electroplating or dip coating. According to this first embodiment, the formation of the metal layer 20 is achieved by electroplating. However, this method is simply an example but not a limitation. The material for the metal layer 20 is selected from a high conductivity metal material such as copper (Cu). The optimum thickness of the metal layer 20 is within the range of 0.01 µm~10 µm. According to this first embodiment, the thickness of the metal layer 20 is 10 µm. However, this thickness is simply an example but not a limitation.

c) Forming the anti-oxidation layer 22 on the outer surface of the metal layer 20, as shown in FIG. 8, thereby finishing the conducting layer 17. The anti-oxidation layer 22 is adapted to protect the metal layer 20, avoiding oxidation of the metal layer 20. The optimum thickness of the anti-oxidation layer 22 is within the range of 0.01 µm~5 µm. According to this first embodiment, the thickness of the anti-oxidation layer 22 is 5 µm. However, this thickness is simply an example but not a limitation.

The material for the anti-oxidation layer 22 is selected from polymer, metal or metal alloy. When polymer is used for the formation of the anti-oxidation layer 22, the formation of the anti-oxidation layer 22 can be achieved by means of coating, spraying or dip coating. When gold (Au), cobalt (Co), titanium (Ti) or tungsten (W), or any of their alloys is used for the formation of the anti-oxidation layer 22, the formation of the anti-oxidation layer 22 can be achieved by means of coating, spraying or dip coating, or preferably, sputtering or electroplating. According to this first embodiment, the anti-oxidation layer 22 is formed of titanium-tungsten alloy by means of sputtering. However, this method is simply an example but not a limitation.

Figure 9:
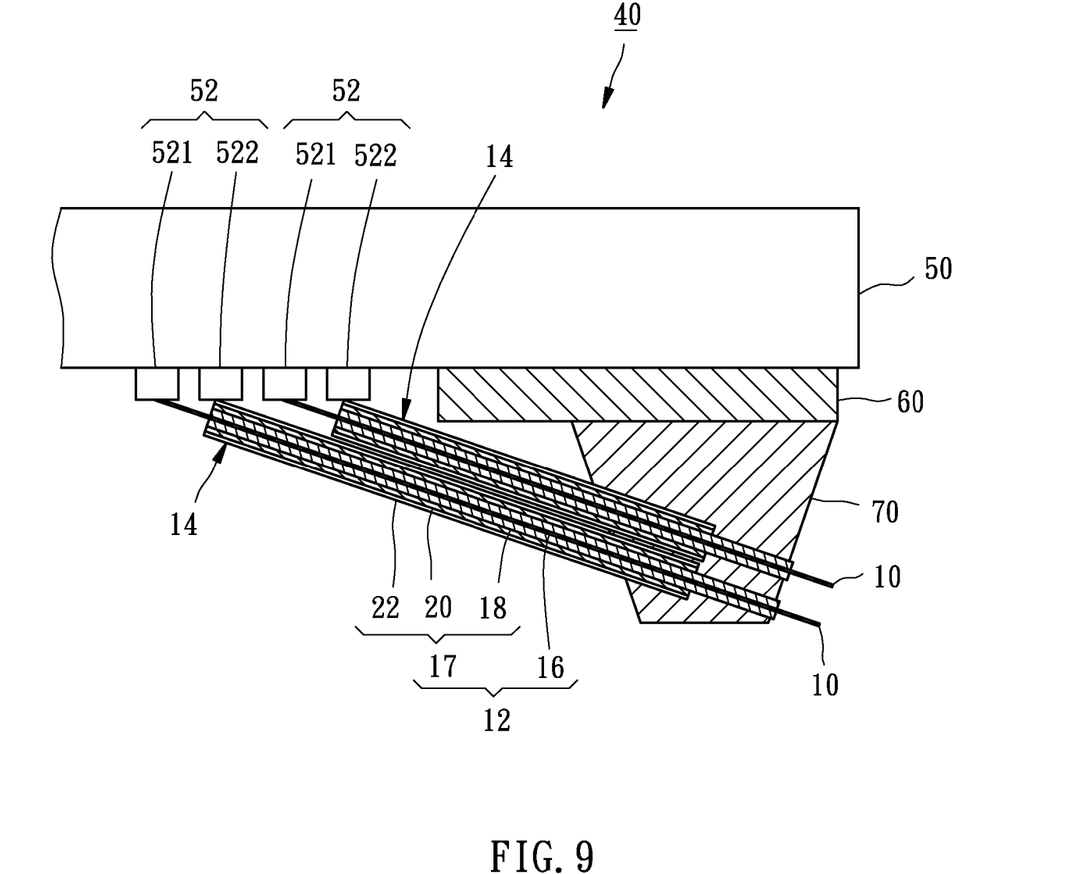
FIG. 9 is a schematic sectional view showing an application of the probe needle in a probe card according to the first embodiment of the present invention.

For fully understanding of the effects of the high-frequency probe 14, a probe card 40 using a number of high-frequency probes 14 of this design is described hereinafter. As shown in FIG. 9, the probe card 40 comprises a circuit board 50, a locating ring 60 and an adherent member 70.

The circuit board 50 has a number of contact sets 52 located on the bottom thereof respectively corresponding to the probes 14. Each contact set 52 includes a signal pad 521 and a grounding pad 522. The signal pad 521 is electrically connected to the bare needle 10 of the associating probe 14 for signal transmission. The grounding pad 522 is electrically connected to one terminal of the metal layer 20 of the associating probe 14 for grounding.

The locating ring 60 is located on the bottom of the circuit board 50 and surrounded by the contact sets 52.

The adherent member 70 is located on the bottom side of the locating ring 60 for holding the probes 14 in place. Further, the adherent member 70 is a conductive material for grounding the metal layers 20 of the probe needles 14. The adherent member 70 according to this first embodiment is a conductive glue. According to this first embodiment, the adherent member 70 connects the metal layers 20 of the probes 14 to ground. However, this arrangement is simply an example but not a limitation.

Figure 10:
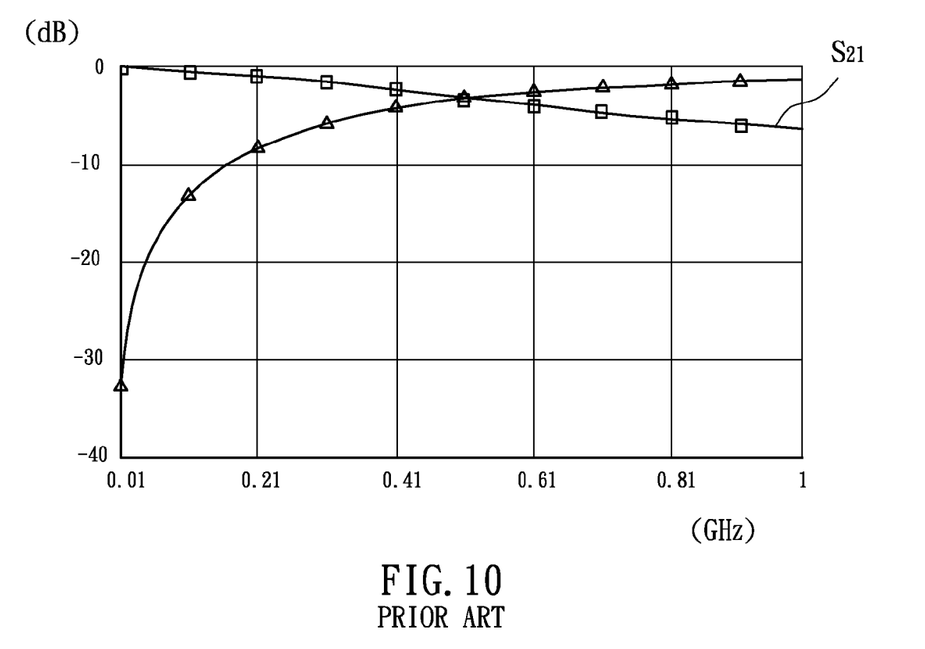
FIG. 10 is a frequency characteristic curve of a probe card according to the prior art.
Figure 11:
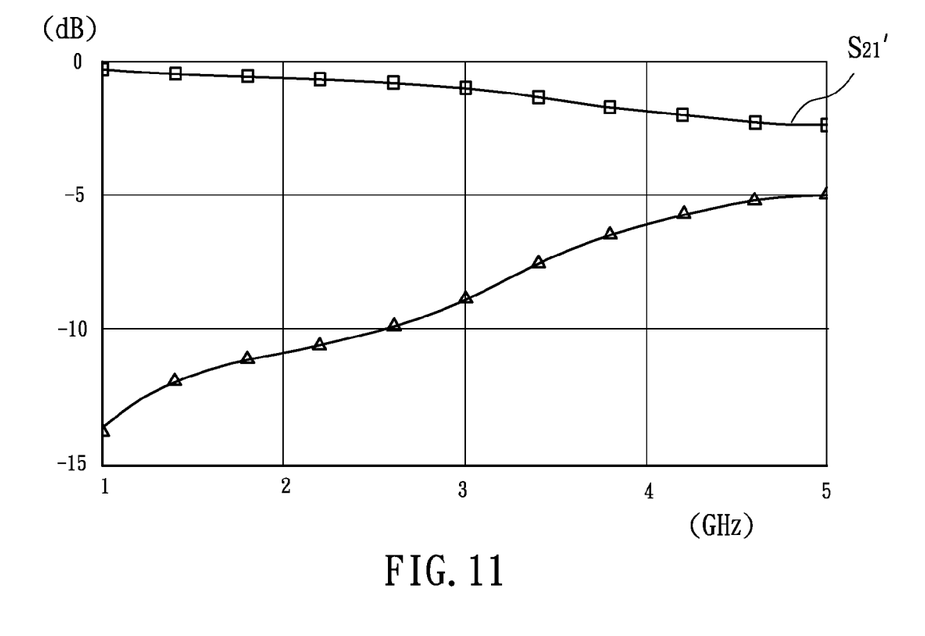
FIG. 11 is a frequency characteristic curve of a probe card according to the first embodiment of the present invention.
Figure 12:
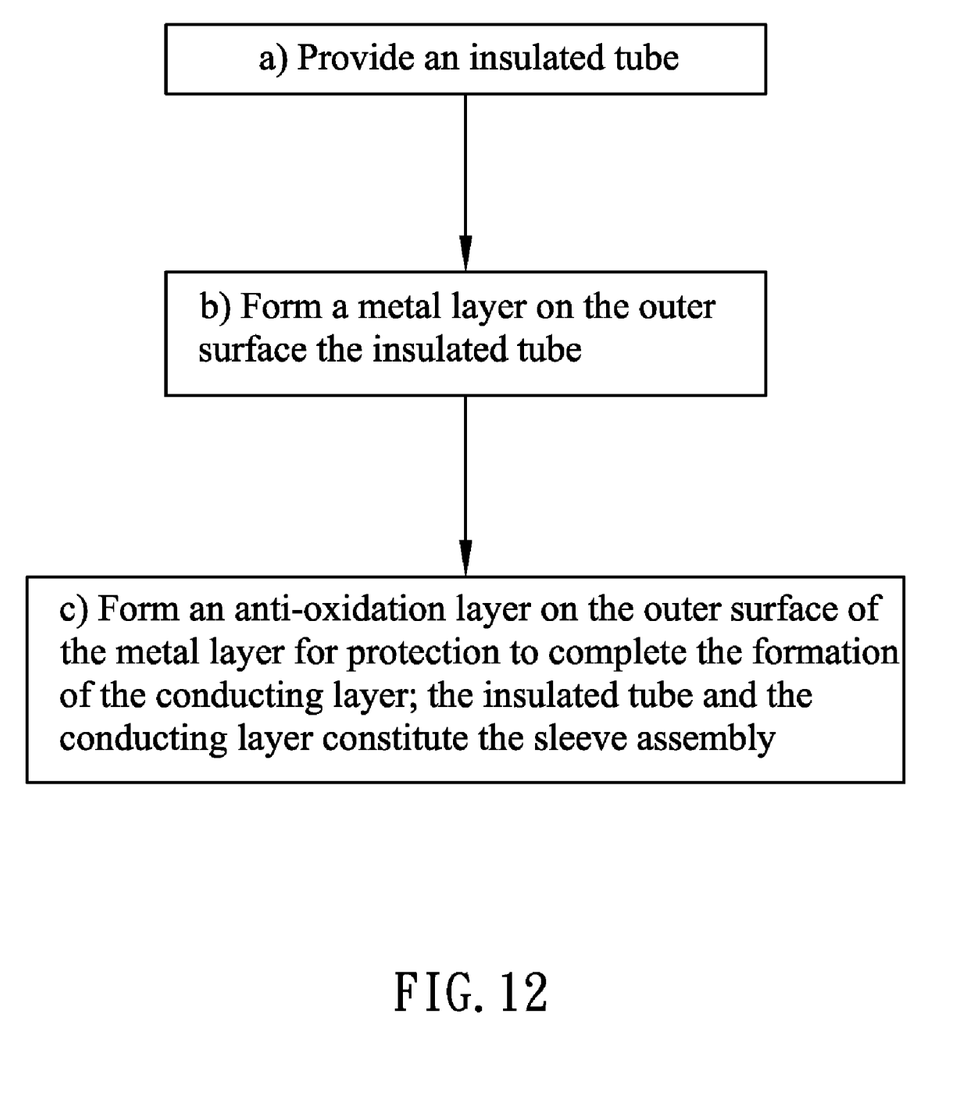
FIG. 12 is a flow chart of the preparation of a probe needle according to a second embodiment of the present invention.

Referring to FIGS. 10 and 11, comparison experimental tests respectively according to the prior-art probe card shown in FIG. 1 and the probe card 40 of the present invention. FIG. 10 shows that the prior-art probe card provides signal transmission within a bandwidth of 500 MHz~600 MHz where the insertion loss (S21) is less than −3 dB; FIG. 11 shows that the probe card 40 of the present invention can provide signal transmission in the high frequency over 5 GHz for the insertion loss (S21') keeping less than −3 dB, i.e., the probe 14 prepared according to the first embodiment of the present invention is practical for the transmission of a high-frequency signal, assuring signal integrity.

Further, the design of the sleeve assembly 12 of the probe 14 facilitates fabrication and installation of the probe needle 14, saving much the manufacturing cost.

When comparing to the probe design of U.S. Pat. No. 6,727,716, the conductive cover 652 of the probe needle 630 according to U.S. Pat. No. 6,727,716 has a thickness about 1.5 mils or 38.1 μm. The conducting layer 17 according to the present invention has a total thickness less than 15.2 μm, i.e., the conducting layer 17 is much thinner when compared to the conductive cover 652, having excellent bending extensibility. In another word, when the probe 14 is forced downwards to touch a test point, the conducting layer 17 effectively lowers the chance of stress cracking, thereby assuring excellent signal transmission.

With respect to signal transmission performance, the combination structure of the sleeve assembly 12 and bare needle 10 is similar to a coaxial cable. The sleeve assembly 12 effectively isolates noises, avoiding signal interference and enhancing signal bandwidth. Therefore, the probe 14 is practical for high frequency testing.

In conclusion, the sleeve assembly 12 of the probe 14 prepared according to the first embodiment of the present invention provides better impedance matching for signal transmission, thereby avoiding signal attenuation. Therefore, when a signal, more particularly, a high-frequency signal is passing through the probe 14, the probe 14 assures signal integrity. When compared to the prior art design, the invention has the advantages of signal integrity.

Figure 13:
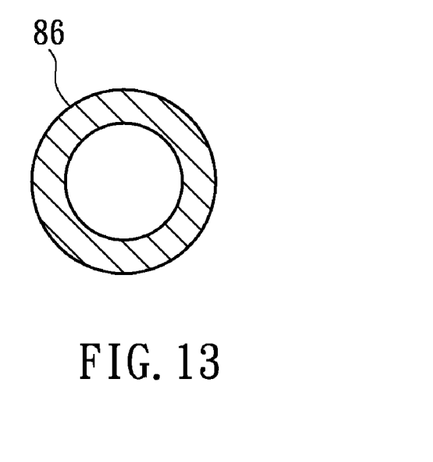
FIG. 13 is a schematic structural view of an insulated tube for probe needle according to the second embodiment of the present invention, showing the inner diameter of the insulated tube.
Figure 17:
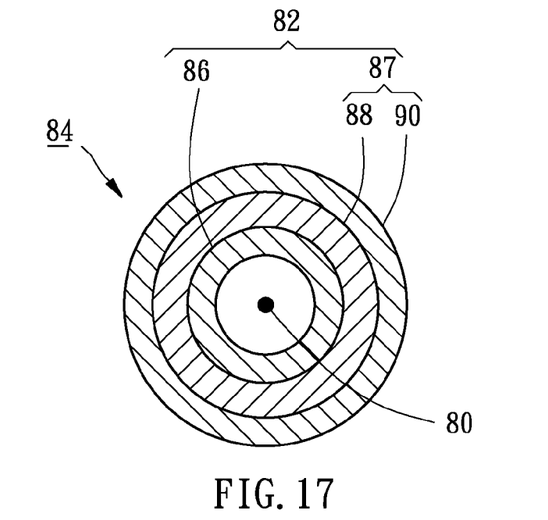
FIG. 17 is a schematic processing view of the second embodiment of the present invention, showing the formation of the anti-oxidation layer.

Referring to FIG. 12 and FIGS. 13~17, a high frequency probe needle preparation method for making a high frequency probe in accordance with a second embodiment of the present invention is done by means of making a sleeve assembly 82 subject to the size of a predetermined bare needle 80 and then sleeving the bare needle 80 to form a high-frequency probe 84. The high frequency probe preparation method includes the steps of:

a) Providing an insulated tube 86, as shown in FIG. 13.

b) Forming a conducting layer 87 on the outer surface of the insulated tube 86, as shown in FIG. 17. The insulated tube 86 and the conducting layer 87 constitute the said sleeve assembly 82. According to this embodiment, the conducting layer 87 comprises a metal layer 88 and an anti-oxidation layer 90.

The metal layer 88 is for electrically grounded. According to this embodiment, the formation of the metal layer 88 can be achieved by means of physical deposition, chemical deposition, mixture of physical and chemical deposition, or electrochemical deposition.

The physical deposition can be a physical vapor deposition (PVD), for example, sputtering. The chemical deposition can be chemical vapor deposition (CVD). The mixture of physical and chemical deposition can be plasma-enhanced chemical vapor deposition (PECVD). The electrochemical deposition can be employed by electroplating or dip coating. According to this first embodiment, the formation of the metal layer 88 is achieved by sputtering. However, this method is simply an example but not a limitation. The material for the metal layer 88 is selected from a high conductivity metal material such as copper (Cu). The optimum thickness of the metal layer 88 is within the range of 0.01 μm~10 μm. According to this second embodiment, the thickness of the metal layer 88 is 10 μm. However, this thickness is simply an example but not a limitation. Further, the sputtering technique for the formation of the metal layer 88 during step b can be performed in either of two ways, i.e., the single-sputtering process and the multi-sputtering process.

Figure 14:
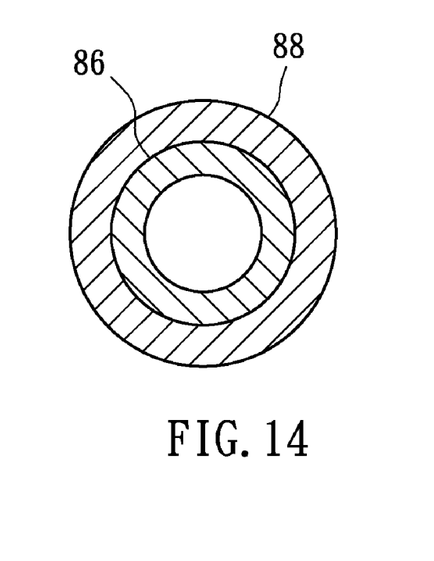
FIG. 14 is a schematic processing view of the second embodiment of the present invention, showing a single-sputtering process of the formation of the metal layer.

The single-sputtering process includes the sub-steps of:

b1) continuously rotating the insulated tube 86 during sputtering, as shown in FIG. 14, to have the desired metal layer 88 be coated on the outer surface of the insulated tube 86 evenly.

Figure 15:
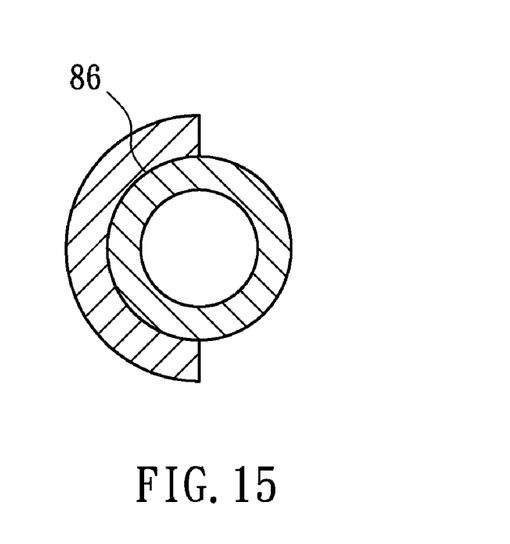
FIG. 15 is a schematic processing view of the second embodiment of the present invention, showing a multi-sputtering process of the formation of the metal layer.
Figure 16:
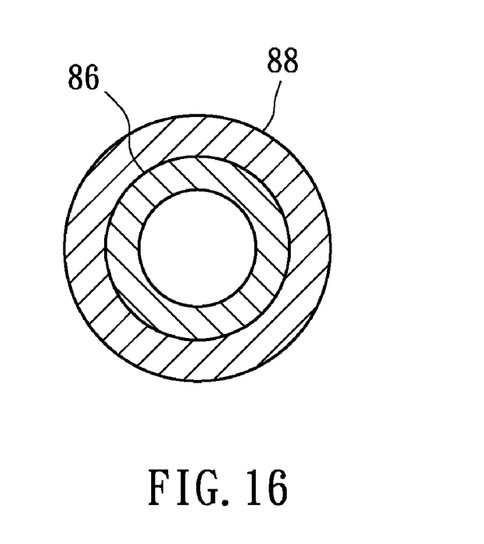
FIG. 16 corresponds to FIG. 15, showing the formation of the metal layer finished.

The multi-sputtering process includes the sub-steps of:

b1) dividing the outer surface of the insulated tube 86 into two zones (not shown); and b2) sputtering the two zones of the insulated tube 86 one after the other to form the metal layer 88, as shown in FIGS. 15 and 16.

By means of either of the aforesaid two sputtering techniques, the desired metal layer 88 is formed on the outer surface of the insulated tube 86 evenly. According to this second embodiment, the metal layer 88 is formed by means of the single-sputtering process. However, this is simply an example but not a limitation.

The step b) of this second embodiment is substantially similar to the step b) of the aforesaid first embodiment with the exception that the aforesaid first embodiment has an extra procedure of the preparation of an adhesion layer. The formation of the adhesion layer enhances fixation of the metal layer to the insulated tube, however the adhesion layer does not affect the transmission of a high frequency electronic signal directly.

c) Forming the anti-oxidation layer 90 on the outer surface of the metal layer 88, as shown in FIG. 17, thereby finishing the conducting layer 87. The anti-oxidation layer 90 is adapted to protect the metal layer 88, avoiding oxidation of the metal layer 88. The optimum thickness of the anti-oxidation layer 90 is within the range of 0.01 μm~5 μm. According to this second embodiment, the thickness of the anti-oxidation layer 90 is 5 μm. However, this thickness is simply an example but not a limitation.

The material for the anti-oxidation layer 90 is selected from polymer, metal or metal alloy. When polymer is used for the formation of the anti-oxidation layer 90, the formation of the anti-oxidation layer 90 can be achieved by means of coating, spraying or dip coating. When gold (Au), cobalt (Co), titanium (Ti) or tungsten (W), or any of their alloys is used for the formation of the anti-oxidation layer 90, the formation of the anti-oxidation layer 90 can be achieved by means of coating, spraying or dip coating, or preferably, sputtering or electroplating. According to this first embodiment, the anti-oxidation layer 90 is formed of polymer, for example, resin, by means of coating. However, this method is simply an example but not a limitation.

Figure 18:
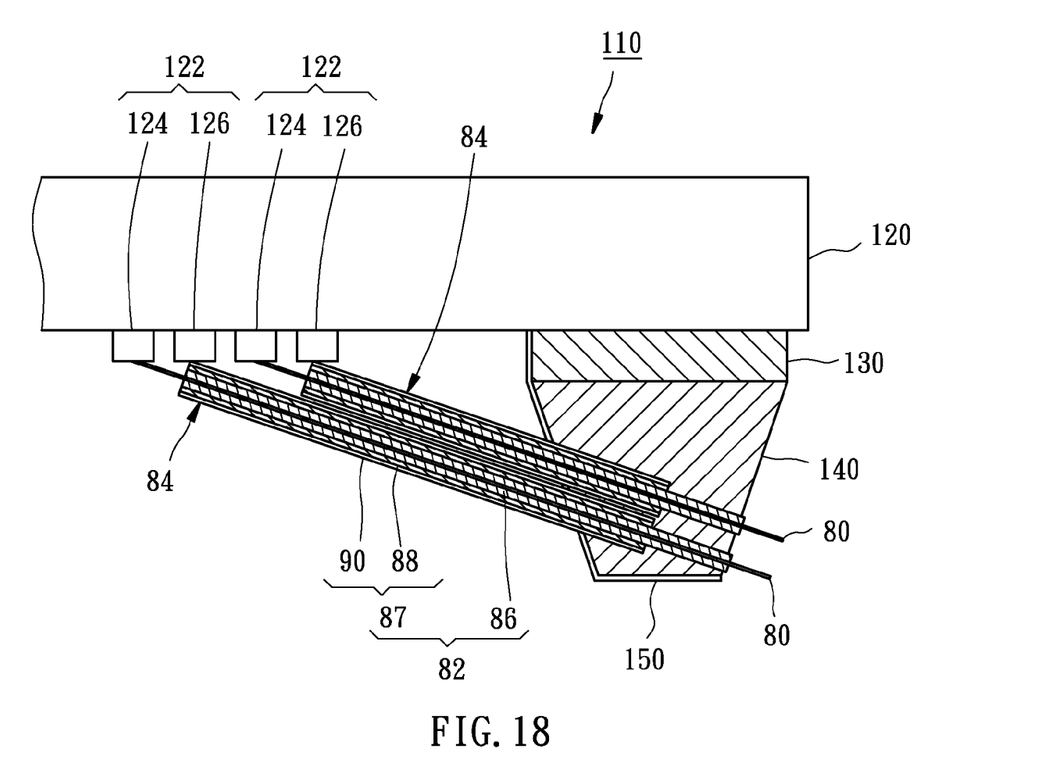
FIG. 18 is a schematic sectional view showing an application of the probe needle in a probe card according to the second embodiment of the present invention.

For fully understanding of the effects of the high-frequency probe 84, a probe card 110 using a number of high-frequency probes 84 of this design is described hereinafter. As shown in FIG. 18, the probe card 110 comprises a circuit board 120, a locating ring 130, an adherent member 140 and a conducting layer 150.

The circuit board 120 has a number of contact sets 122 located on the bottom thereof respectively corresponding to the probes 84. Each contact set 122 includes a signal pad 124 and a grounding pad 126. The signal pad 124 is electrically connected to the bare needle 80 of the associating probe 84 for signal transmission. The grounding pad 126 is electrically connected to the metal layer 88 of the associating probe 84 for grounding.

The locating ring 130 is located on the bottom of the circuit board 120 and surrounded by the contact sets 122.

The adherent member 140 is located on the bottom side of the locating ring 130 for holding the probes 84 in place. Further, the adherent member 140 is an electrically insulated material, for example, epoxy resin. However, the use of epoxy resin is simply an example but not a limitation.

The conducting layer 150 is covered on the locating ring 130 and the adherent member 140, and electrically connected to the metal layer 88 for grounding. According to this second embodiment, the conducting layer 150 connects the metal layer 88 to ground, however this arrangement is simply an example but not a limitation.

Further, the probe card 110 according to this second embodiment is substantially similar to the aforesaid first embodiment with the exception of the use of the conducting layer 150 for grounding.

According to experimental tests respectively made on the prior-art probe card and the probe card 110 of this second embodiment of the present invention, the probe card 110 achieves the same effects as the probe card 40 of the aforesaid first embodiment of the present invention.

In other words, the probe 84 prepared according to the second embodiment of the present invention is practical for the transmission of a high-frequency electronic signal, assuring signal integrity.

Although particular embodiments of the invention have been described in detail for purposes of illustration, various modifications and enhancements may be made without departing from the spirit and scope of the invention. Accordingly, the invention is not to be limited except as by the appended claims

What is claimed is:

1. A high-frequency probe preparation method for making a high frequency probe by means of making a sleeve assembly subject to the size of a predetermined bare needle and then sleeving said bare needle by the sleeve assembly to form a high-frequency probe, the high frequency probe preparation method comprising the steps of:
   a) providing an insulated tube; and
   b) forming a conducting layer on the outer surface of said insulated tube, said conducting layer comprising at least one metal layer for electrically grounded, said metal layer having a thickness within 0.01 μm~10 μm, said insulated tube and said conducting layer constituting said sleeve assembly;
   wherein said metal layer is formed by means of one of the methods of physical deposition, chemical deposition, mixture of physical and chemical deposition, and electrochemical deposition.

2. The high-frequency probe preparation method as claimed in claim 1, wherein the formation of said conducting layer during step b) is done by means of forming an adhesion layer on the outer surface of said insulated tube by a sputtering technique and then depositing said metal layer on said adhesion layer.

3. The high-frequency probe preparation method as claimed in claim 2, wherein said adhesion layer is selected from a material group of chrome, titanium, tungsten and their alloys.

4. The high-frequency probe preparation method as claimed in claim 2, wherein said adhesion layer has a thickness within 0.01 μm~0.2 μm.

5. The high-frequency probe preparation method as claimed in claim 2, wherein the sputtering technique for the formation of said adhesion layer on the outer surface of said insulated tube comprises a sub-step of continuously rotating said insulated tube during sputtering to have the desired adhesion layer be coated on the outer surface of said insulated tube evenly.

6. The high-frequency probe preparation method as claimed in claim 2, wherein the sputtering technique for the formation of said adhesion layer on the outer surface of said insulated tube comprises the sub-steps of
   b1) dividing the outer surface of said insulated tube into multiple zones; and
   b2) sputtering said multiple zones one after another to form said adhesion layer on the outer surface of said insulated tube.

7. The high-frequency probe preparation method as claimed in claim 1, wherein the formation of said metal layer is done by means of one of the techniques of physical vapor deposition, chemical vapor deposition, plasma-enhanced chemical vapor deposition, electroplating and dip coating.

8. The high-frequency probe preparation method as claimed in claim 7, wherein the formation of said conducting layer is done by means of depositing said metal layer on said insulated tube by a sputtering technique and continuously rotating said insulated tube during sputter deposition of said metal layer.

9. The high-frequency probe preparation method as claimed in claim 7, wherein the formation of said metal layer comprises the sub-steps of:
   b1) dividing the outer surface of said insulated tube into multiple zones; and
   b2) sputtering said multiple zones one after another to form said metal layer on the outer surface of said insulated tube.

10. The high-frequency probe preparation method as claimed in claim 1, wherein said metal layer is deposited by the material made of copper.

11. The high-frequency probe preparation method as claimed in claim 1, wherein the formation of said conducting layer comprises a sub-step of forming an anti-oxidation layer on the outer surface of said metal layer, said anti-oxidation layer being selected from a material group of gold, cobalt, titanium, tungsten, and their alloys.

12. The high-frequency probe preparation method as claimed in claim 11, wherein the formation of said anti-oxidation layer is done by means of one of the techniques of coating, spraying and dip coating.

13. The high-frequency probe preparation method as claimed in claim 11, wherein said anti-oxidation layer is formed of a metal or metal alloy by means of one of the techniques of sputtering and electroplating.

14. The high-frequency probe preparation method as claimed in claim 12, wherein said anti-oxidation layer has a thickness within 0.01 μm~5 μm.

15. A probe card, comprising:
   a plurality of probes prepared according to claim 1;
   a circuit board, said circuit board comprising a plurality of contact sets located on a bottom thereof corresponding to said probes, each said contact set comprising a signal pad electrically connected to the bare needle of the associating probe for signal transmission and a grounding pad electrically connected to the metal layer of the associating probe for electrically grounded;

a locating ring mounted on the bottom of said circuit board and surrounded by said contact sets; and an adherent member located on a bottom side of said locating ring for holding said probes in place.

* * * * *